United States Patent
Sasada et al.

(10) Patent No.: US 8,987,655 B2
(45) Date of Patent: Mar. 24, 2015

(54) OPTICAL MODULE HAVING AT LEAST ONE LIGHT RECEIVING ELEMENT WITH A WIRING PART COVERS A PART OF A SIDE SURFACE OF A MESA PART

(71) Applicant: Oclaro Japan, Inc., Kanagawa (JP)

(72) Inventors: Michihide Sasada, Kanagawa (JP); Hiroshi Hamada, Kanagawa (JP); Masato Shishikura, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 268 days.

(21) Appl. No.: 13/720,502

(22) Filed: Dec. 19, 2012

(65) Prior Publication Data

US 2013/0161497 A1    Jun. 27, 2013

(30) Foreign Application Priority Data

Dec. 21, 2011    (JP) .................................. 2011-280240

(51) Int. Cl.
*H01L 31/00* (2006.01)
*H01L 31/0232* (2014.01)
*G02B 6/42* (2006.01)

(52) U.S. Cl.
CPC .......... *H01L 31/0232* (2013.01); *G02B 6/4206* (2013.01); *G02B 6/4215* (2013.01)
USPC ...................................... 250/214.1; 250/239

(58) Field of Classification Search
USPC ............... 250/214.1, 214 R, 239, 216, 208.1; 257/80–85, 184–186, 438; 385/11, 13, 385/92–94
See application file for complete search history.

(56) References Cited

U.S. PATENT DOCUMENTS

| | | | |
|---|---|---|---|
| 8,118,498 B2 * | 2/2012 | Sasada et al. ................... | 385/93 |
| 2009/0263082 A1 | 10/2009 | Sasada et al. | |
| 2010/0148041 A1 | 6/2010 | Takamatsu et al. | |

FOREIGN PATENT DOCUMENTS

| | | |
|---|---|---|
| JP | 2001-308367 A | 11/2001 |
| JP | 2009-162942 A | 7/2009 |
| JP | 2010-141089 A | 6/2010 |

* cited by examiner

*Primary Examiner* — Que T Le
(74) *Attorney, Agent, or Firm* — Mattingly & Malur, P.C.

(57) ABSTRACT

An optical module includes a light-receiving element configured to convert an incident optical signal to an electric signal. The light-receiving element includes a mesa part configured to laminate at least a first semiconductor layer, a light absorption semiconductor layer that absorbs an optical signal entering from a light reception surface, and a second semiconductor layer. The light-receiving element also includes an electrode part disposed on a top of the mesa part and a wiring part that covers a part of a side surface of the mesa part. The optical module includes a lens configured to condense an optical signal from an optical fiber onto the light reception surface. The wiring part is disposed at a position based on an intensity distribution of the optical signal on the light reception surface.

11 Claims, 13 Drawing Sheets

OPTICAL MODULE HAVING AT LEAST ONE LIGHT RECEIVING ELEMENT WITH A WIRING PART COVERS A PART OF A SIDE SURFACE OF A MESA PART

CROSS-REFERENCE TO RELATED APPLICATION

The present application claims priority from Japanese Application JP2011-280240 filed on Dec. 21, 2011, the content of which is hereby incorporated by reference into this application.

BACKGROUND OF THE INVENTION

1. Field of the Invention

The present invention relates to an optical module.

2. Description of the Related Art

An optical module used in an optical communication device generally includes an optical fiber, a lens and a light-receiving element. In the optical module, the optical fiber causes an optical signal input from the outside of the optical module to exit to the lens, and the lens focuses the optical signal on a light reception surface of the light-receiving element. Then, the light-receiving element converts the received optical signal to an electric signal.

However, there may be a problem of light return in which a part of the optical signal exiting from the optical fiber via the lens to the light-receiving element is reflected on the light reception surface of the light-receiving element, and the reflected light returns to the optical fiber. In this case, as a result, noise is generated in the electric signal of the optical communication device.

As the technology for suppressing the noise due to the reflection of the optical signal on the light reception surface of the light-receiving element as described above, there is known a technology of disposing the light-receiving element to deviate from the center of the optical axis of the lens (see US Patent Application Publication No. US2009/0263082), or a technology of disposing the light-receiving element so as to incline the normal direction on the light reception surface of the light-receiving element with respect to the optical axis of the lens (see US Patent Application Publication No. US2010/0148041).

SUMMARY OF THE INVENTION

As described above, in the case of disposing the light-receiving element to deviate with respect to the center of the optical axis of the lens, aberration occurs because the incident light from the optical fiber does not pass through the center of the lens, thereby generating image distortion on the light reception surface in the light-receiving element. Further, in the case of disposing the light-receiving element so as to incline the normal direction on the light reception surface of the light-receiving element with respect to the optical axis of the lens, a light beam passing through the lens becomes not a circular shape but an elliptical shape on the light reception surface, thereby similarly generating image distortion.

Here, in the light-receiving element for use in a high speed transmission system, it is necessary to decrease a light receiving area diameter of the light-receiving element to reduce junction capacity for the purpose of its high response, and to decrease a CR time constant of a capacity component (C) and resistance (R) of the light-receiving element. Particularly, for example, if the performance of 10 Gbit/s or more is required, it is necessary to decrease the light receiving area diameter of the light-receiving element up to about 10 μm which is almost the same size as a mode field diameter of a single mode fiber. Hence, it is difficult to appropriately couple incident light within the light receiving area diameter. In this case, if there is used as described above the structure in which coupling distortion is generated on the light reception surface in the light-receiving element, it becomes more difficult to effectively couple the incident light within the light receiving area diameter, which may result in lowering the light reception sensitivity of the light-receiving element.

More specifically, an example in the case of disposing the light-receiving element in offset relation as described above is described with reference to FIG. 13 hereinafter. FIG. 13 is a diagram illustrating the problem to be solved by one or more embodiments of the present invention. Specifically, FIG. 13 illustrates a simulation result, for example, in the case of using a sphere lens having a diameter of 1.5 mm as a condenser lens and disposing in offset relation the light-receiving element having a light receiving area diameter of 15 μm. The circle illustrated in FIG. 13 corresponds to the light receiving area diameter of the light-receiving element. Moreover, the dots illustrated in FIG. 13 correspond to light intensity, which represents that a location where the density of dots is higher has stronger light intensity than another location. As illustrated in FIG. 13, in the case of disposing the light-receiving element in offset relation, image distortion is generated due to aberration, and the formed image elongates toward the lower side in FIG. 13. Moreover, as illustrated in FIG. 13, light reaches also on the outside of the light receiving area diameter. The light reaching on the outside cannot reach an absorption layer described later within the light-receiving element and cannot contribute to the light reception sensitivity of the light-receiving element. In the example illustrated in FIG. 13, about 98 percent of the light beam distributes within the light receiving area diameter, but the remaining about 2 percent light beam distributes on the outside of the light receiving area diameter. In addition, as the light receiving area diameter of the light-receiving element becomes smaller, the light distributed on the outside of the light receiving area diameter increases.

In view of the above-mentioned problem, it is an object of one or more embodiments of the present invention to achieve an optical module which suppresses the generation of noise due to reflection on a light reception surface of a light-receiving element while suppressing the fall of light reception sensitivity of the light-receiving element.

(1) According to an exemplary embodiment of the present invention, an optical module includes at least one light-receiving element configured to convert an incident optical signal to an electric signal. The at least one light-receiving element includes a mesa part configured to laminate at least a first semiconductor layer, a light absorption semiconductor layer that absorbs an optical signal entering from a light reception surface, and a second semiconductor layer. The at least one light-receiving element also includes an electrode part disposed on a top of the mesa part and a wiring part that covers a part of a side surface of the mesa part and that is disposed so as to extend from a part of an outer periphery of the electrode part toward an outside of the mesa part. The optical module includes a lens configured to condense an optical signal from an optical fiber onto the light reception surface of the at least one light-receiving element. The wiring part is disposed at a position based on an intensity distribution of the optical signal on the light reception surface.

(2) In the optical module according to the above-mentioned Item (1), the wiring part is disposed along a longitudinal direction of the intensity distribution.

(3) In the optical module according to the above-mentioned Item (2), the intensity distribution has an elliptical shape and the wiring part is disposed along a long axis direction of the elliptical shape.

(4) In the optical module according to any one of the above-mentioned Items (1) to (3), a center of the light reception surface of the at least one light-receiving element is disposed so as to be deviated to a first direction perpendicular to an optical axis of the lens. The wiring part is disposed at a position along a second direction opposite to the first direction.

(5) In the optical module according to the above-mentioned Item (4), the at least one light-receiving element is a back-illuminated light-receiving element.

(6) In the optical module according to any one of the above-mentioned Items (1) to (3), the at least one light-receiving element is disposed so as to incline a normal direction of the light reception surface with respect to an optical axis of the lens. The wiring part is disposed at a position along a direction of the inclination.

(7) In the optical module according to the above-mentioned Item (6), the at least one light-receiving element is one of a back-illuminated light-receiving element and a front-illuminated light-receiving element.

(8) The optical module according to any one of the above-mentioned Items (1) to (4) further includes a plurality of band-pass filters aligned in line, through which the optical signal from the optical fiber enters, and a total reflection mirror which reflects the optical signal reflected on surfaces of the plurality of band-pass filters and which is disposed in opposite to the plurality of band-pass filters. The at least one light-receiving element comprises a plurality of the light-receiving elements aligned in a predetermined interval. The condenser lens condenses each of the optical signals exited from the plurality of band-pass filters onto each of the light reception surfaces of the plurality of the light-receiving elements.

(9) In the optical module according to any one of the above-mentioned Items (1) to (4), the mesa part further includes a reflection layer between the light absorption semiconductor layer and the first semiconductor layer. The electrode part has a ring shape. The optical signal from the optical fiber enters via the lens to the mesa part and is absorbed in the light absorption semiconductor layer, and thereafter, at least apart of the optical signal is further reflected in the reflection layer.

(10) According to another exemplary embodiment of the present invention, an optical module includes a light-receiving element configured to convert an incident optical signal to an electric signal. The light-receiving element includes a mesa part configured to laminate at least a first semiconductor layer, a light absorption semiconductor layer that absorbs an optical signal entering from a light reception surface to convert the optical signal to an electric signal, and a second semiconductor layer. The light-receiving element also includes an electrode part formed on a top of the mesa part and a wiring part formed by elongating from a part of an outer periphery of the electrode part toward an outside of the mesa part so as to cover a part of side faces of the mesa part. The optical module also includes a lens for condensing an optical signal from an optical fiber onto the light reception surface of the light-receiving element. A center axis of the light reception surface of the light-receiving element is disposed so as to be deviated to a first direction perpendicular to an optical axis of the lens. The wiring part is disposed at a position along a second direction opposite to the first direction.

(11) In the optical module according to the above-mentioned Item (10), the light-receiving element is a back-illuminated light-receiving element.

DETAILED DESCRIPTION OF THE INVENTION

Figure 1:
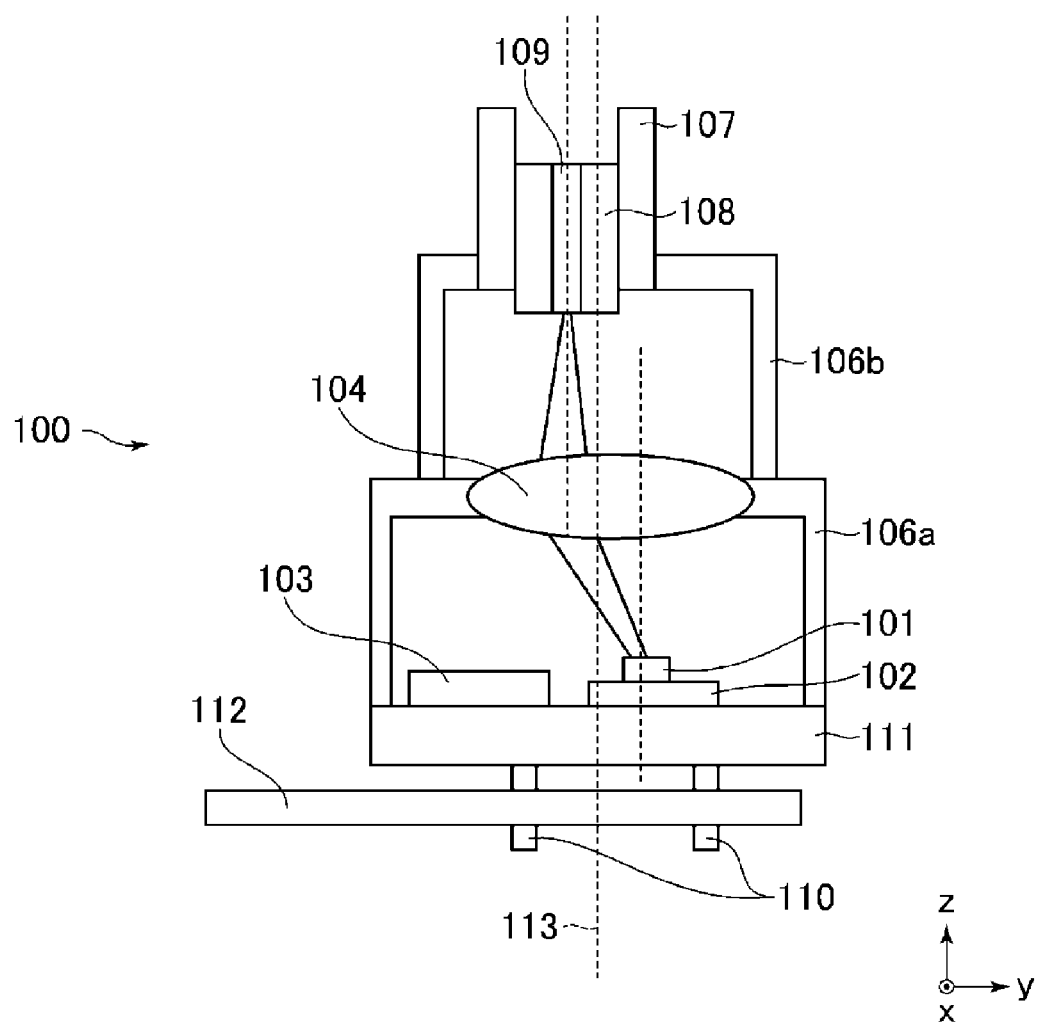
FIG. 1 is a diagram illustrating the whole structure of an optical module in a first embodiment of the present invention.

Referring to the accompanying drawings, embodiments of the present invention are described below. In the drawings, the same or similar components are denoted by the same reference symbols, and repetitive description thereof is omitted.

First Embodiment

FIG. 1 is a diagram illustrating a structure of an optical module according to a first embodiment of the present invention. An optical module 100 according to this embodiment mainly includes a light-receiving element 101, a light-receiving element support member 102, a mounted element 103 such as a preamplifier, and a lens 104, as illustrated in FIG. 1. In addition, the light-receiving element 101, the support member 102, the mounted element 103, the lens 104, and the like are provided, for example, within a housing 106 which is a coaxial type package.

The housing 106 includes a lens housing back part 106a and a lens housing front part 106b. The lens housing 106, which is, for example, a member made of metal formed into one body, includes the lens housing back part 106a having a cylindrical external shape, and the lens housing front part 106b having a cylindrical external shape whose diameter is smaller than that of the lens housing back part 106a. Further, the lens 104 is disposed between the lens housing back part 106a and the lens housing front part 106b.

An optical fiber housing part 107 is disposed in a hole provided on the upper side of the lens housing front part 106b. The optical fiber housing part 107 is formed of, for example, cylinder-shaped metal. In the optical fiber housing part 107, an optical fiber 109 covered with a connector 108 or a ferrule is disposed.

On a stem 111 disposed on the lower side of the lens housing back part 106a, the support member 102 and the mounted element 103 are disposed. Moreover, on the support member 102, the light-receiving element 101 is disposed. Specifically, for example, the light-receiving element 101 is disposed (in offset relation) to deviate from an optical axis 113 of the lens 104, as described later. Here, the light-receiving element 101 includes a photo-diode (PD) for converting an optical signal corresponding to light to an electric signal. The light-receiving element 101 and the mounted element 103 are electrically connected via, for example, lead pins 110 made of metal to a flexible substrate disposed on the outside of the optical module 100. That is, an electric signal output from the light-receiving element 101 or the mounted element 103 is transmitted via the lead pin 110 to a flexible printed circuit 112.

Next, the path of the optical signal exiting from the optical fiber 109 is described. The optical fiber 109 causes the optical signal to exit to the lens 104. Here, as illustrated in FIG. 1, a center axis of the optical fiber is disposed to deviate slightly to the left side from the optical axis of the lens 104. Reversely, the light-receiving element 101 is disposed to deviate slightly to the right side from the optical axis of the lens 104. With this structure, the exiting light from the optical fiber 109 deviates from the center axis of the lens 104 and enters to the lens 104. Then, the exiting light from the lens 104 obliquely enters the light reception surface of the light-receiving element 101. Accordingly, the reflected light on the light reception surface of the light-receiving element 101 is also obliquely reflected with respect to the light reception surface. Thus, it is possible to prevent the reflected light from returning again via the lens 104 to the optical fiber 109. In addition, here, the optical axis of the exiting light corresponds to a virtual light beam that is the center of advancing luminous flux.

Figure 2:
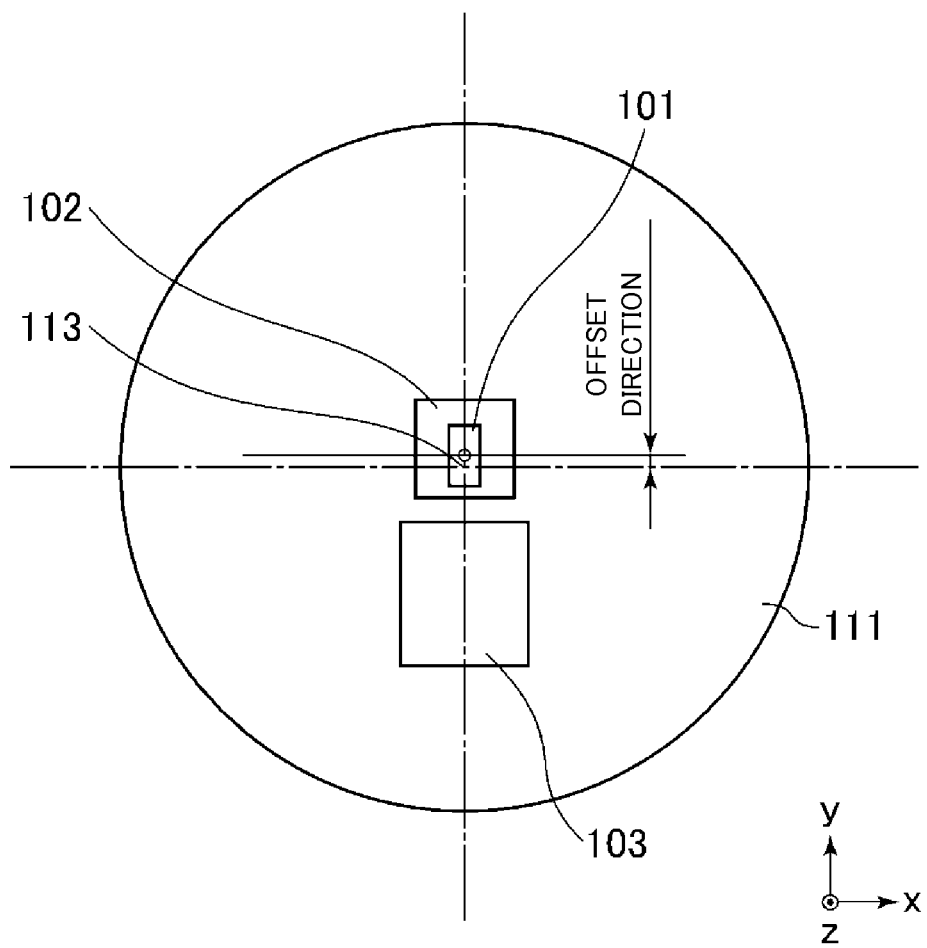
FIG. 2 is a diagram illustrating arrangement of a light-receiving element disposed above a stem illustrated in FIG. 1.

FIG. 2 is a diagram illustrating the arrangement of the light-receiving element disposed above the stem illustrated in FIG. 1. As illustrated in FIG. 2, on the top face of the stem 111, the light-receiving element 101 provided on the support member 102, and the mounted element 103 are disposed. Specifically, the light reception part of the light-receiving element 101 is disposed (in offset relation) to deviate slightly from the center of the stem 111 to a positive y axis direction. In addition, the positive y axis direction is equivalent to an offset direction in FIG. 2. Moreover, in the above-mentioned structure, the center of the stem 111 is assumed to substantially coincide with the optical axis 113 of the lens.

Figure 3:
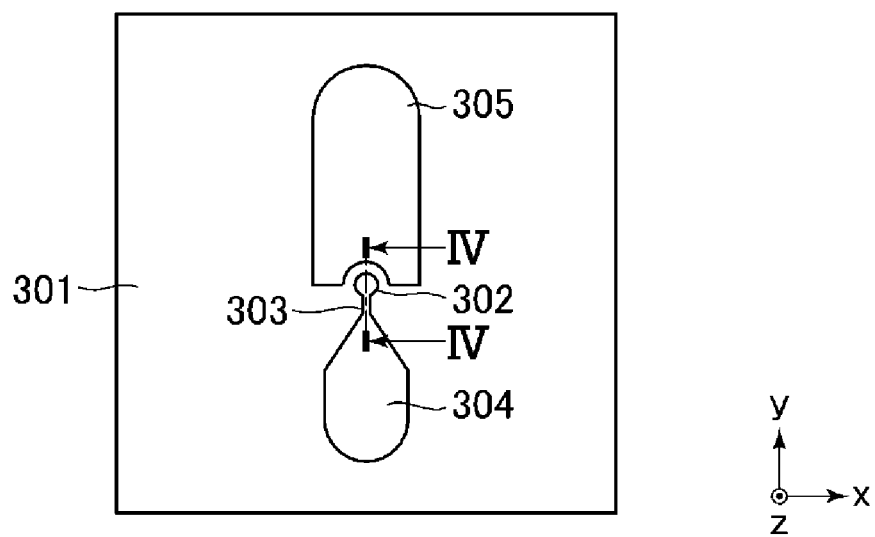
FIG. 3 is an enlarged schematic diagram of a top face of the light-receiving element illustrated in FIG. 2.

FIG. 3 is an enlarged schematic diagram of the top face of the light-receiving element 101 illustrated in FIG. 2. As illustrated in FIG. 3, the light-receiving element 101 includes a semiconductor substrate 301, a light reception part 302 formed on the semiconductor substrate 301, an p-type electrode pad 304 connected via a wiring part 303 to the light reception part 302, and an n-type electrode pad 305. Specifically, the light reception part 302 is connected to the p-type electrode pad 304 via the wiring part 303 extending from the outer periphery of the light reception part 302. In addition, the p-type electrode pad 304 and the n-type electrode pad 305, which are to be connected to the support member 102 or the like, for example, by using soldering, are formed so as to have large areas as compared to that of the light reception part 302.

Figure 4:
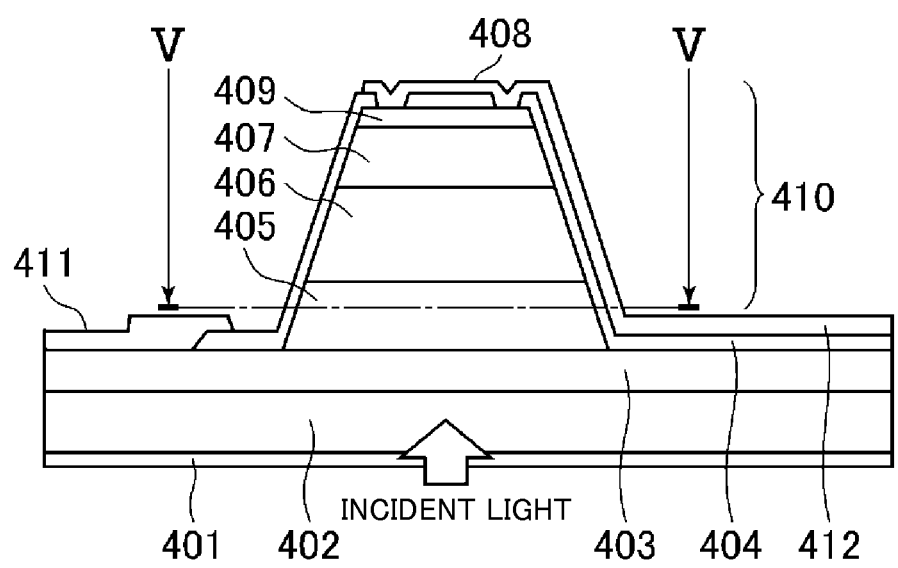
FIG. 4 is a schematic diagram illustrating a cross section IV-IV of FIG. 3.
Figure 4:
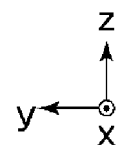
Figure 5:
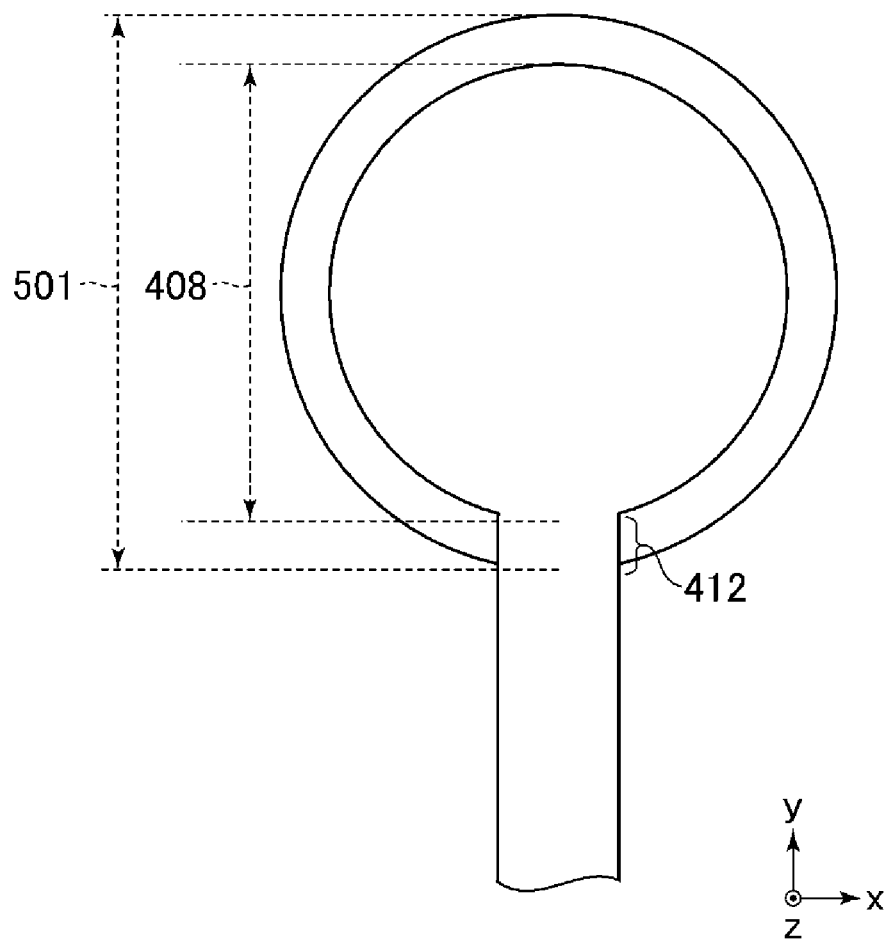
FIG. 5 is a schematic diagram illustrating the top face as seen from a direction V-V of FIG. 4.

FIG. 4 is a schematic diagram illustrating a cross section IV-IV of FIG. 3. FIG. 5 is a schematic diagram illustrating the top face as seen from a direction V-V of FIG. 4. Note that, in FIG. 5, reference numeral 501 corresponds to a diameter of a mesa part 410. As illustrated in FIG. 4, in the periphery of the light-receiving element 101, there are formed a low reflection film 401, a semiconductor substrate 402, and an n-type semiconductor contact layer 403 in order from the lower side in FIG. 4. Moreover, on the n-type semiconductor contact layer 403, there are laminated an n-type semiconductor layer 405, an absorption layer 406, a p-type semiconductor layer 407, and a p-type semiconductor contact layer 409, which form the mesa part 410. Moreover, a passivation film 404 is formed so as to cover the top part or side face part of the mesa part 410 and the top part of the n-type semiconductor contact layer 403. Then, a p electrode 408 is formed on the top of the mesa part 410 covered by the passivation film 404. The p electrode 408 is connected to the p-type electrode pad 304 via a wiring part 412 formed so as to extend from a part of the outer periphery of the p electrode 408. The wiring part 412 is formed with a minimum width so as to cover only a part of the side face of the mesa part 410, as illustrated in FIG. 5. This is because the wiring part 412 on the side faces of the mesa part 410 results in a parasitic capacity component if the wiring part 412 is formed on all of the side faces of the mesa part 410. Moreover, the wiring part 412 and the p electrode 408 are formed, for example, by vapor-depositing Au. Moreover, the wiring part 412 and the p electrode 408 function as a high reflection material for incident light. Further, an n electrode 411 is formed on the side opposite to the p electrode 408 as seen from the mesa part 410.

Next, the path of the light entering from the lower side in FIG. 4 is described. As is clear from FIG. 4, the light-receiving element in this embodiment corresponds to a back-illuminated mesa PIN-PD. In addition, it should be understood that the incident light corresponds to the light entering from the lens 104 illustrated in FIG. 1. The incident light is absorbed when passing through the absorption layer 406 and is converted to an electric signal. At this time, the absorption layer 406 cannot absorb 100 percent of the incident light. Hence, the light which has not been absorbed in the absorption layer 406 passes through the p-type semiconductor layer 407 and the p-type semiconductor contact layer 409. The light is reflected by the p electrode 408 or the wiring part 412 and enters into the absorption layer 406 again. On the other hand, on the side face of the mesa part 410, where the wiring part 412 is not formed, the reflection of light is reduced because the wiring part 412 reflecting the light is not formed.

Figure 13:
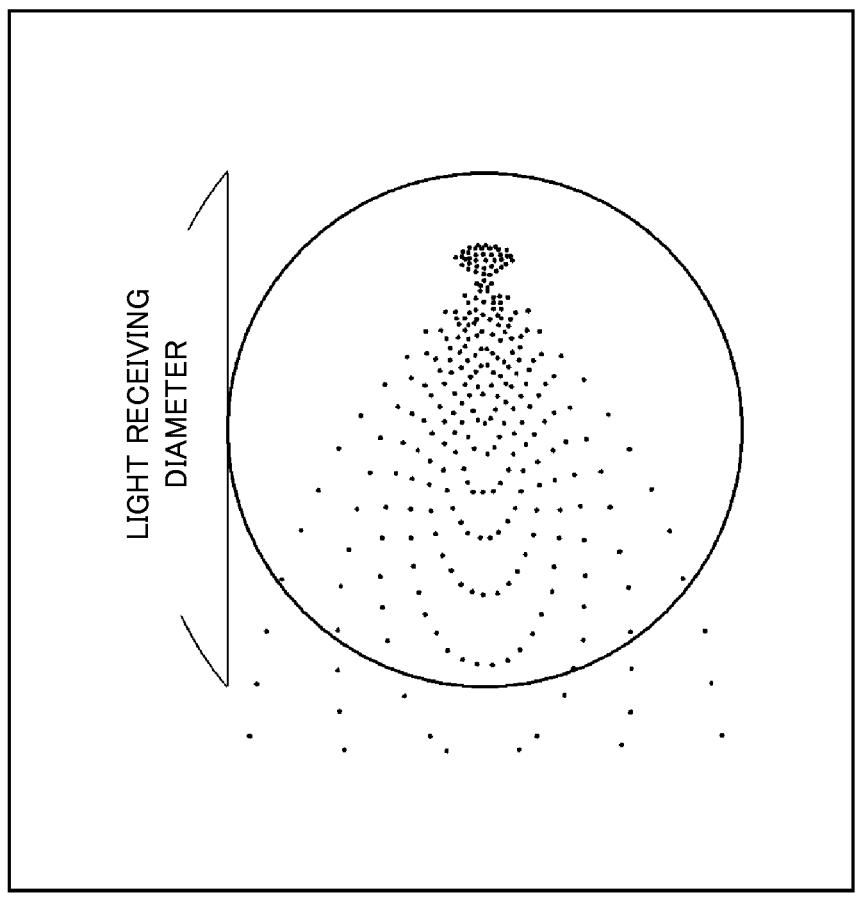
FIG. 13 is a diagram illustrating a problem to be solved by the present invention.

Here, as described with reference to FIG. 1, in this embodiment, the light reception surface of the light-receiving element 101 is disposed offset from the center of the optical axis 113 of the lens 104 to the positive y direction. Hence, imaging becomes out of focus due to the aberration of the lens 104 in a negative y direction. Accordingly, the wiring part 412 is provided along the direction in which the imaging becomes out of focus. In this structure, a permissible range of the position of the light reception surface in the negative y direction can be broadened as compared to the case where the wiring part 412 is provided along another direction on the side face of the mesa part 410. Moreover, as illustrated in FIG. 13, in this embodiment, the light distributes also on the outside of a light receiving area diameter. However, a part of the light distributed on the outside of the light receiving area diameter can be reflected at least on the wiring part 412, and as a result, light reception sensitivity is improved.

Figure 6:
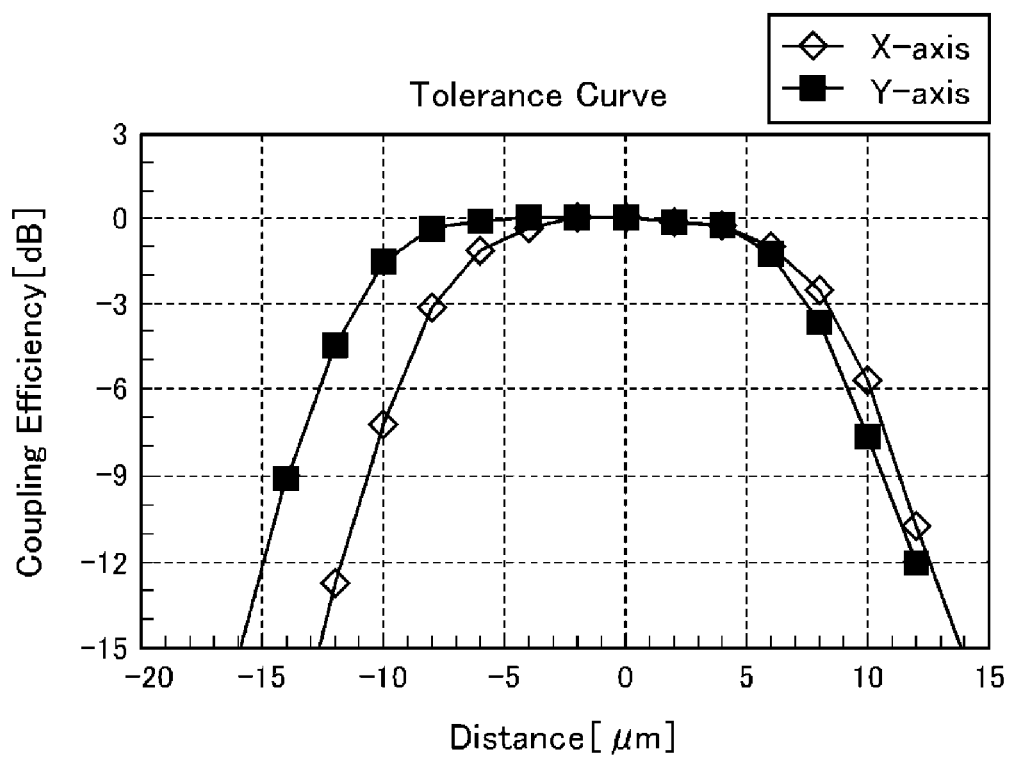
FIG. 6 is a graph showing tolerance curves in an x axis direction and a y axis direction of the light-receiving element in the first embodiment.

Specifically, description is made with reference to FIG. 6. FIG. 6 is a graph showing tolerance curves in an x axis direction and a y axis direction in the case of using the light-receiving element in this embodiment. In addition, in FIG. 6, the vertical axis represents coupling efficiency and the horizontal axis represents a distance from the center of the light reception surface. As shown in FIG. 6, when the coupling range based on a coupling loss of −3 dB is defined as a light receiving area diameter, the light receiving area diameter is 16 μm in the x axis direction and 18 μm in the y axis direction. That is, it is seen that the light receiving area diameter in the y axis direction can be increased by about 13% than the light receiving area diameter in the x axis direction, by providing the wiring part 412 in the above-mentioned way. Moreover, as shown in FIG. 6, the center of the light receiving area diameter in the y axis direction also deviates and the light receiving area diameter is broadened to the direction in which the wiring part 412 is disposed. In addition, the definition of the light receiving area diameter may be made on the basis of any coupling loss other than the above-mentioned example.

Here, for example, in the case of using a single mode fiber as the optical fiber 109, the mode field diameter of this optical fiber 109 is about 10 μm. When the imaging magnification of the condenser lens 104 is set to be 1, the mode field diameter becomes about 10 μm even on the light reception surface of the light-receiving element 101. In this case, the difference between this mode field diameter and the light receiving area diameter in the x axis direction becomes about 6 μm. On the other hand, the light receiving area diameter in the y axis direction becomes about 8 μm. That is, according to this embodiment, it is possible to broaden the permissible range of positioning in a manufacturing process by about 2 μm in the y axis direction.

The present invention is not limited to the above-mentioned embodiment, and may be replaced with another structure which is substantially identical with the structure illustrated in the above-mentioned embodiment, another structure which brings the same function and effect, or another structure which can attain the same object. Specifically, for example, in the above-mentioned embodiment, the case of using the back-illuminated mesa PIN-PD as the light-receiving element 101 has been described, but a back-illuminated mesa APD may be used. Moreover, the wiring part 412 is formed using the p electrode 408, but the n electrode 411 may be used. Further, the case of using a coaxial type package as the package of the optical module 100 has been described above, but the same offset arrangement is feasible even using, for example, a box type butterfly package, and hence the box type package may be used. Moreover, in the above-mentioned embodiment, the wiring part 412 is disposed along the direction in which the imaging is out of focus due to the aberration of the lens 104, but even when the wiring part 412 is not disposed completely along the direction, a certain level of effect can be obtained. Specifically, it is desired to dispose the wiring part 412 within a range of ±45°, preferably, ±30° with respect to the direction in which the imaging is out of focus.

Second Embodiment

Next, a second embodiment of the present invention is described. An optical module 200 in this embodiment is different from the optical module 100 in the first embodiment mainly in that the optical module 200 is a wavelength-division-multiplexing reception module for receiving a plurality of optical signals having different wavelengths. Note that, description is hereinafter omitted in respect of the same points as the first embodiment.

Figure 7:
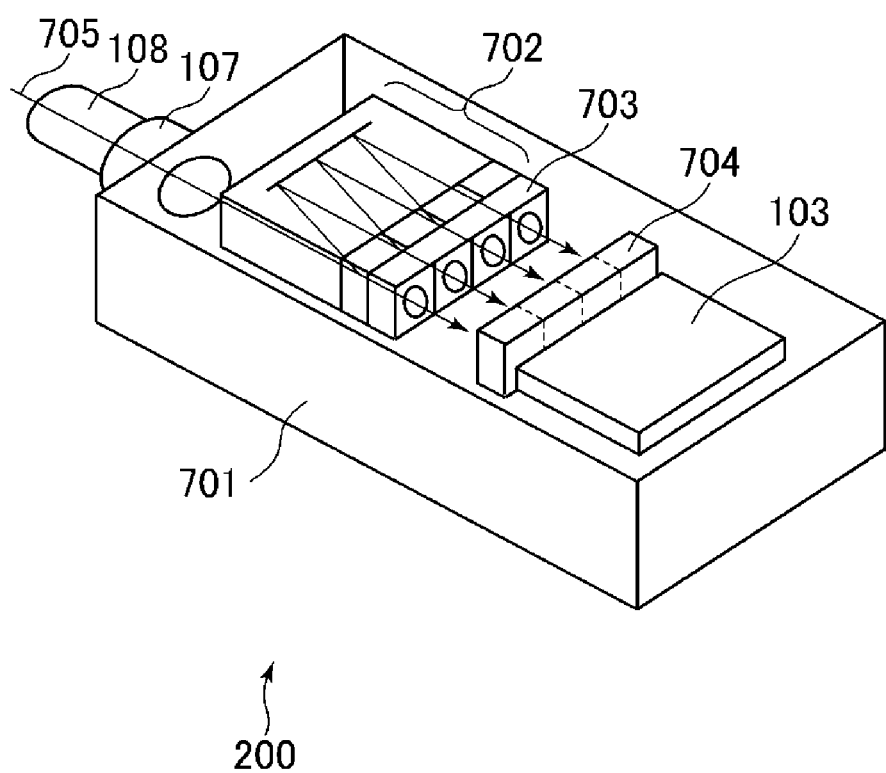
FIG. 7 is a diagram illustrating the whole structure of an optical module in a second embodiment of the present invention.

FIG. 7 is a diagram illustrating the whole structure of the optical module in this embodiment. As illustrated in FIG. 7, the optical module 200 in this embodiment mainly includes a wavelength demultiplexing filter 702, a lens 703, and a plurality of light-receiving elements 101 provided on a sub-mount 704. In addition, the wavelength demultiplexing filter 702, the lens 703, the sub-mount 704, and the like are provided, for example, within a box type package 701.

The optical fiber 109 is disposed at one end of the package 701 of the optical module 200, and the optical signal from the optical fiber 109 exits to the wavelength demultiplexing filter 702 to be described later. As illustrated in FIG. 7, the package 701 corresponds to, for example, a so-called box type package. The optical fiber 109 causes a wavelength-division-multiplexed signal multiplexed with a plurality of optical signals having different wavelengths to exit to the wavelength demultiplexing filter 702. Note that, in this embodiment, as one example, description is made assuming that the wavelength-division-multiplexed signal contains four optical signals having different wavelengths.

Figure 8:
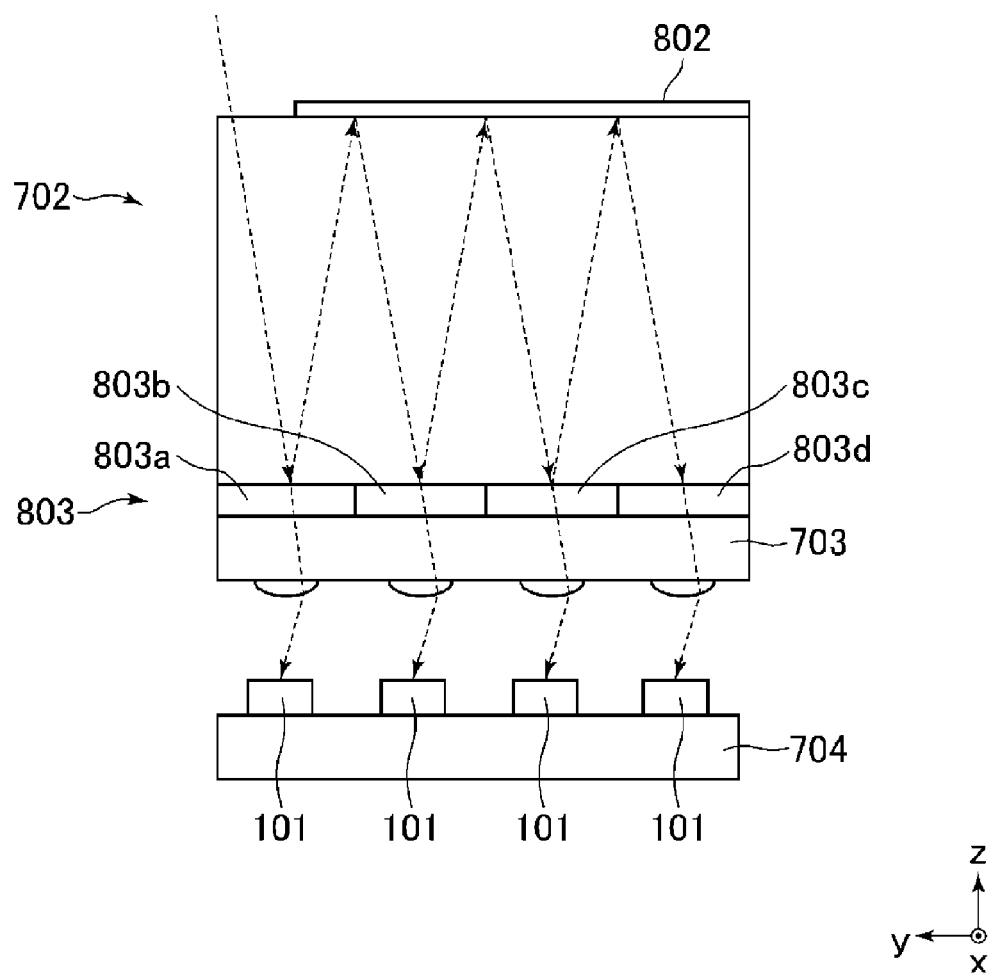
FIG. 8 is a diagram illustrating a structure of a wavelength demultiplexing filter illustrated in FIG. 7.

The wavelength demultiplexing filter 702 demultiplexes a wavelength-division-multiplexed signal 705 from the optical fiber 109 to each of signal wavelengths. Specifically, the wavelength demultiplexing filter 702, as illustrated in FIG. 8, includes a total reflection mirror 802 for totally reflecting the light entering from the optical fiber 109, and a filter part 803 including first to fourth band-pass filters 803a to 803d. Moreover, the lens 703 is disposed on the exit side of the wavelength demultiplexing filter 702 so as to condense the light exiting from each of the band-pass filters 803a to 803d onto its corresponding light-receiving element 101.

Figure 9:
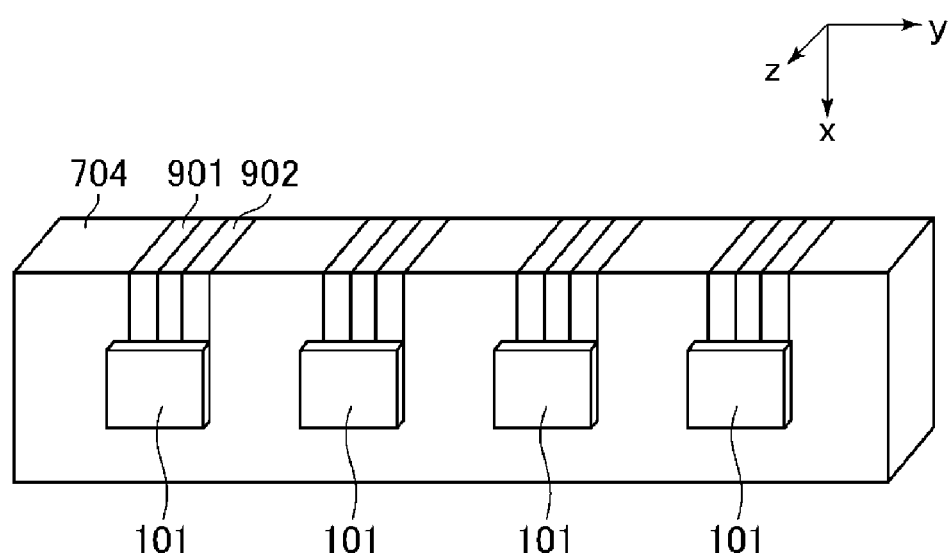
FIG. 9 is a diagram illustrating arrangement of light-receiving elements illustrated in FIG. 8.

Light-receiving elements 101 are provided so as to be aligned on the sub-mount 704 at the positions opposite to the lens 703. Specifically, as illustrated in FIG. 9, the light-receiving elements 101 are aligned in a predetermined interval, for example, on the surface of the sub-mount 704 on the lens 703 side. Moreover, each light-receiving element 101 receives its corresponding light signal from the lens 703. Further, in the same manner as the first embodiment, each light-receiving element 101 is electrically connected to the mounted element 103 via a p electrode pad 901 and an n electrode pad 902.

Next, the path of the light entering from the optical fiber 109 in this embodiment is described. As illustrated in FIG. 8, the optical signal from the optical fiber 109 enters to the first band-pass filter 803a at a predetermined angle with respect to the z axis. The first band-pass filter 803a transmits only light having a predetermined wavelength and reflects light having other wavelengths on the surface of the first band-pass filter 803a with a reflection angle corresponding to its incident angle. The reflected light reflected on the surface of the first band-pass filter 803a is reflected on the total reflection mirror 802 and enters to the second band-pass filter 803b at the same angle as the optical signal from the optical fiber 109. Similarly, the second band-pass filter 803b transmits only light having a predetermined wavelength and reflects light having other wavelengths on the surface of the second band-pass filter 803b with a reflection angle corresponding to its incident angle. Similarly hereafter, the first to fourth band-pass filters 803a to 803d transmit light having each predetermined wavelength, thereby demultiplexing the optical signal from the optical fiber 109. Specifically, for example, in FIG. 9, the angle of the incident light from the optical fiber 109 to the z axis is set to be 10° with respect to the z axis. Thus, the incident light advances in a zigzag manner within the wavelength demultiplexing filter 702 while holding the incident angle, and the light exiting from each of the band-pass filters 803a to 803d also exits to the lens 703 while maintaining the angle thereof.

The light exiting from the band-pass filter 803 passes through the lens 703 and enters each light-receiving element 101. At this time, if the lens 703 bends the exiting light so that the exiting light becomes perpendicular to the surface of each light-receiving element 101, the problem of so-called light return occurs. Accordingly, in this embodiment, it is required to cause the light not to perpendicularly enter the surface of the light-receiving element 101, and in this case, it is impossible to set the path where the light exiting from the lens 703 passes through the center of the lens 703. Hence, similarly to the above description, the aberration of the lens 703 becomes a problem.

Specifically, in this embodiment, as illustrated in FIG. 8, the light entering from the lens 703 to each light-receiving element 101 has an angle toward the positive y direction with respect to the normal direction of the light-receiving element 101. In this case, in the same way as the first embodiment, image distortion occurs due to the aberration of the lens 703 in the negative y direction. Accordingly, in this embodiment, in the same way as the above-mentioned first embodiment, the wiring part 412 is provided along the direction where the image distortion occurs. With this structure, the permissible range of the position of the light reception surface in the negative y direction can be broadened as compared to the case where the wiring part 412 is provided in other directions. Moreover, it is possible to reflect apart of the light distributed on the outside of the light receiving area diameter at least at the wiring part 412. As a result, the light reception sensitivity of each light-receiving element 101 is improved. In addition, as described above, the exit angle of the light passing through each of the band-pass filters 803a to 803d is the same. Therefore, each light-receiving element 101 may be disposed so as to be set in the same direction with respect to the incident light from the lens 703.

The present invention is not limited to the above-mentioned embodiments, and the present invention may be replaced with another structure which is substantially identical with the structure illustrated in the above-mentioned embodiments, another structure which brings the same function and effect, or another structure which can attain the same object. For example, the case where the optical signal having four different wavelengths is input from the optical fiber 109 has been described above, but the optical signal having another number of wavelength components may be input. In this case, it should be understood that the number of the band-pass filters 803 and the number of the light-receiving elements 101 change in accordance with the number of the wavelength components exiting from the optical fiber 109. Further, in the same manner as the first embodiment, as the light-receiving elements 101, the back-illuminated mesa PIN-PD may be used and the back-illuminated mesa APD may be used. Moreover, for example, the wiring part 412 may be formed by extending the p electrode 408 or extending the n electrode 411. Further, in the above description, the use of the box type package 701 has been exemplified, but a coaxial type package may be used. Moreover, as described above, the wiring part 412 is disposed along the direction in which the imaging is out of focus due to aberration of the lens 104, but even when the wiring part 412 is not disposed completely along the direction, a certain level of the effect can be obtained. Specifically, it is desired to dispose the wiring part 412 within a range of ±45°, preferably, ±30° with respect to the direction in which the imaging is out of focus.

Third Embodiment

Next, a third embodiment of the present invention is described. This embodiment is different from the first embodiment mainly in that the light-receiving elements 101 are disposed so as to incline the normal direction of the light reception surface of the light-receiving elements 101 with respect to the optical axis 113 of the light from the lens 104 instead of disposing the light-receiving elements 101 in offset relation as described above.

Figure 10:
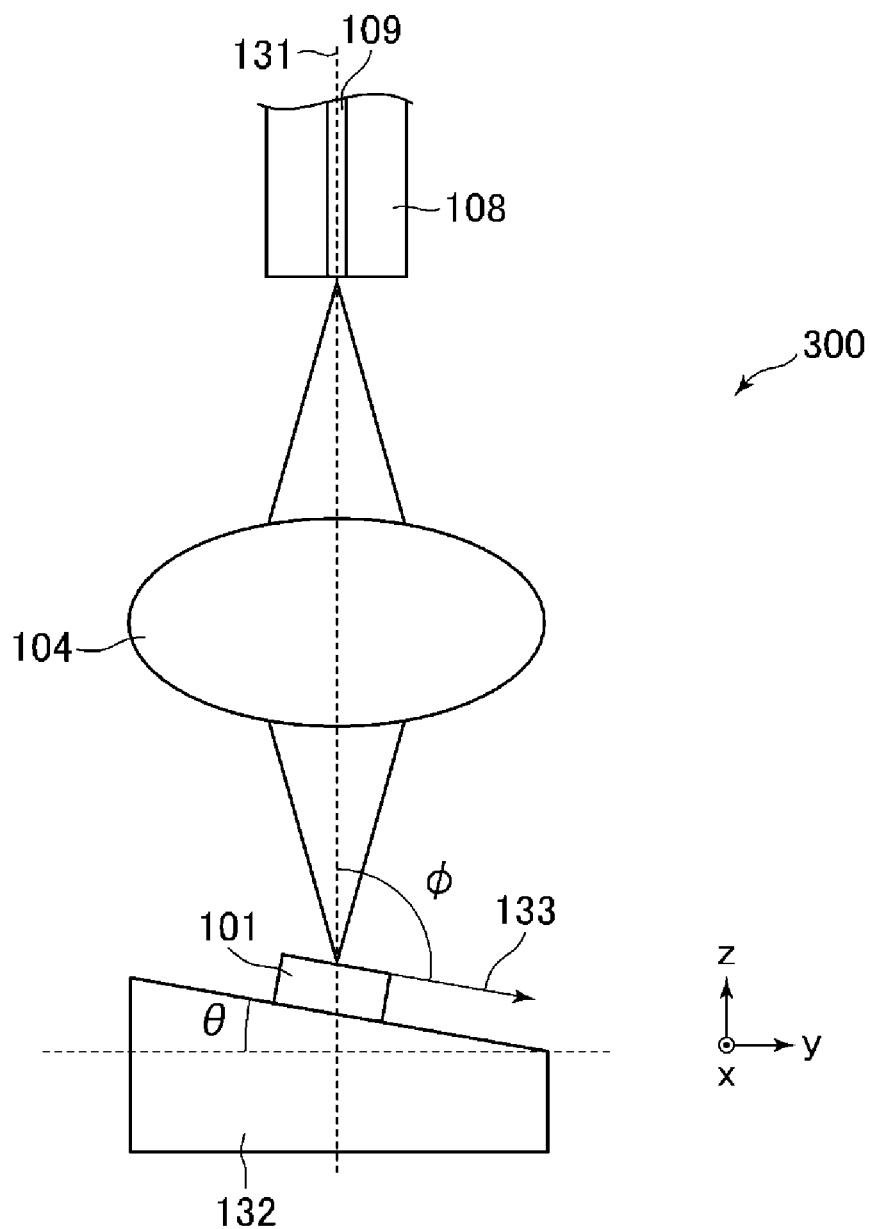
FIG. 10 is a diagram illustrating the whole structure of an optical module in a third embodiment of the present invention.

FIG. 10 is a diagram illustrating the whole structure of an optical module 300 in the third embodiment of the present invention. As illustrated in FIG. 10, the optical module 300 in this embodiment includes the optical fiber 109, the lens 104, and the light-receiving elements 101 in the same way as the first embodiment. However, unlike the first embodiment, the tip of the optical fiber 109 is substantially perpendicular to the center axis 131 of the optical fiber 109, and the optical axis of the light exiting from the optical fiber 109 is substantially identical with the center axis 131 of the optical fiber 109. The light exiting from the optical fiber 109 condenses via the lens 104 on the light reception surface of the light-receiving element 101.

Figure 11:
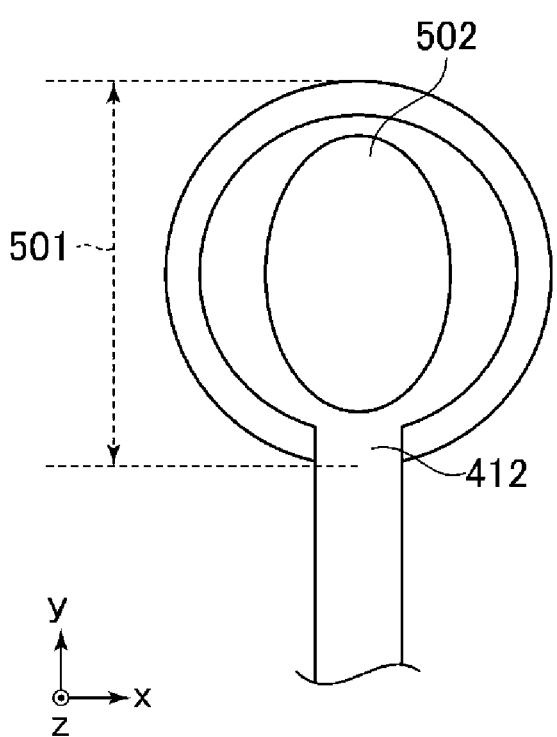
FIG. 11 is a diagram illustrating a situation of imaging on alight reception surface of a light-receiving element in the third embodiment.

Here, as illustrated in FIG. 10, the light-receiving element 101 is disposed to incline with respect to the x-y plane of FIG. 10. In addition, in FIG. 10, the inclination angle is represented by θ. Specifically, for example, as illustrated in FIG. 10, the light-receiving element 101 is disposed on a trapezoid-shaped sub-mount 132 as seen in the cross section, thereby being disposed to incline with respect to the x-y plane. With this structure, the formed image on the light reception surface of the light-receiving element 101 becomes not a circular shape but an elliptical shape. Moreover, the major axis of the elliptical shape depends on the inclination angle. A schematic view of this situation is illustrated in FIG. 11. As illustrated in FIG. 11, the wiring part 412 is provided along the major axis of the elliptical shape of a formed image 502 on the light reception surface of the light-receiving element 101. With this structure, the permissible range of positioning of the light-receiving element 101 in the y direction can be broadened in the negative y direction as compared to the case where the wiring part 412 is provided in other directions.

The present invention is not limited to the above-mentioned embodiments, and the present invention may be replaced with another structure which is substantially identical with the structure illustrated in the above-mentioned embodiments, another structure which brings the same function and effect, or another structure which can attain the same object. Specifically, for example, as the light-receiving elements 101, the back-illuminated mesa PIN-PD may be used, and the back-illuminated mesa APD may also be used. Moreover, in the above description, the wiring part 412 is disposed along the major axis direction of the formed image 502 in the light-receiving element 101, but even when the wiring part 412 is not disposed completely along the direction, a certain level of the effect can be obtained. Specifically, it is desired to dispose the wiring part 412 within a range of ±45°, preferably, ±30° with respect to the major axis direction of the formed image 502 in the light-receiving element 101.

Fourth Embodiment

Next, a fourth embodiment of the present invention is described. This embodiment is different from the third embodiment mainly in that a front-illuminated mesa PIN-PD is used as the light-receiving elements 101. Note that, the description is hereinafter omitted in respect of the same points as the third embodiment.

Figure 12:
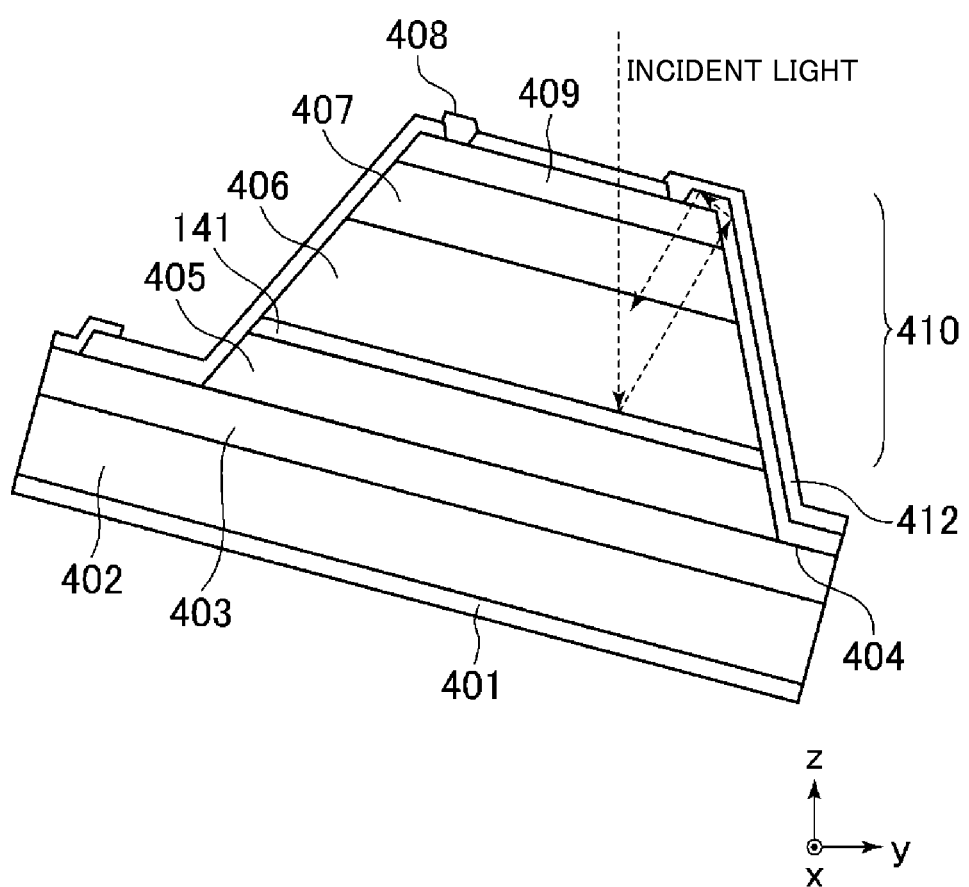
FIG. 12 is a schematic diagram of a cross section of the light-receiving element in the third embodiment.

FIG. 12 is a schematic diagram illustrating a cross section of the light-receiving element in this embodiment. As illustrated in FIG. 12, the n-type semiconductor contact layer 403 is laminated on the semiconductor substrate 402, and the n-type semiconductor layer 405, a reflection layer 141, the absorption layer 406, the p-type semiconductor layer 407, and the p-type semiconductor contact layer 409, which are formed into a mesa shape, are laminated on the n-type semiconductor contact layer 403. Moreover, the passivation film 404 is formed on the top face and side faces of the mesa part 410, and the p electrode 408 having a ring shape as seen from the above in FIG. 12 is formed on the top face of the mesa part 410. Moreover, the wiring part 412 is formed on a part of the side faces of the mesa part 410, and the low reflection film 401 is formed on the surface of the semiconductor substrate 402 opposite to the mesa part 410 in the same way as the first embodiment. In addition, as a method for forming the reflection layer 141 below the absorption layer 406, for example, a method disclosed in Japanese Patent Application Laid-open No. 2001-308367, or a method for forming a so-called distributed Bragg reflector (DBR) layer may be used.

Here, as illustrated in FIG. 12, the light-receiving element 101 is disposed to incline with respect to the x-y plane in FIG. 12 in the same way as the third embodiment. Accordingly, the formed image on the light reception surface of the light-receiving element 101 becomes not a circular shape but an elliptical shape. Moreover, the length of the major axis of the elliptical shape depends on an inclination angle. Hence, in this embodiment, in the same way as the third embodiment, the wiring part 412 is provided along the major axis of the elliptical shape. Moreover, the wiring part 412 substantially aligns the direction of the reflected light on the reflection layer 141 in the light-receiving element 101 with the direction of the wiring part 412. Specifically, arrangement is made so that the angle (corresponding to the angle Φ in FIG. 10) between the optical axis 113 of the lens 104 and a direction 133 toward the wiring part 412 is set to be 90° or more. With this structure, the permissible range of the position of the light reception surface in the y direction can be broadened, and the absorption efficiency of the optical signal in the absorption layer 406 can be improved as compared to the case where the wiring part 412 is provided in other directions.

Next, the path of the optical signal from the lens 104 is described. As described above, the light-receiving element 101 in this embodiment is a so-called front-illuminated PD, and hence the optical signal passing through the lens 104 enters the mesa part 410 from the upper side thereof. Of this optical signal, light which has not been absorbed in the absorption layer 406 is reflected on the reflection layer 141 underlying the absorption layer 406 and enters to the absorption layer 406 again. Of the light that has entered the absorption layer 406 again, the light which is not absorbed passes through the absorption layer 406. The light is reflected on the wiring part 412 and absorbed again in the absorption layer 406. With this structure, the absorption efficiency of an optical signal in the absorption layer 406 can be improved.

The present invention is not limited to the above-mentioned embodiments, and the present invention may be replaced with another structure which is substantially identical with the structure illustrated in the above-mentioned embodiments, another structure which brings the same function and effect, or another structure which can attain the same object. Specifically, as described above, for example, the case of using the front-illuminated mesa PIN-PD as the light-receiving element 101 has been described, but the front-illuminated mesa APD may be used. Moreover, the case of forming the wiring part 412 by extending the p electrode 408 has been described, but the wiring part 412 may be formed by extending the n electrode 411. Further, as the package of the optical module 300, either of the box type package and the coaxial type package may be used. In addition, the first semiconductor layer and the second semiconductor layer in the claims correspond to, for example, the n-type semiconductor layer 403 and the p-type semiconductor layer 407, respectively, in the first to fourth embodiments. Moreover, in the above description, the wiring part 412 is disposed along the major axis direction of the formed image 502 in the light-receiving element 101, but even when the wiring part 412 is not disposed completely along the direction, a certain level of the effect can be obtained. Specifically, it is desired to dispose the wiring part 412 within a range of ±45°, preferably, ±30° with respect to the major axis direction of the formed image 502 in the light-receiving element 101. Further, there has been described a mode in which the light-receiving element is disposed to incline with respect to the incident light, thereby suppressing the reflected light and improving the absorption efficiency of the optical signal. However, the same effect can be obtained also in a structure in which the incident light obliquely enters the light-receiving element.

What is claimed is:

1. An optical module, comprising:
    at least one light-receiving element configured to convert an incident optical signal to an electric signal, the at least one light-receiving element including;
    a mesa part configured to laminate at least a first semiconductor layer, a light absorption semiconductor layer that absorbs an optical signal entering from a light reception surface, and a second semiconductor layer,
    an electrode part disposed on a top of the mesa part, and
    a wiring part that covers a part of a side surface of the mesa part and that is disposed so as to extend from a part of an outer periphery of the electrode part toward an outside of the mesa part; and
    a lens configured to condense an optical signal from an optical fiber onto the light reception surface of the at least one light-receiving element,
    wherein the wiring part is disposed at a position based on an intensity distribution of the optical signal on the light reception surface.

2. The optical module according to claim 1, wherein the wiring part is disposed along a longitudinal direction of the intensity distribution.

3. The optical module according to claim 2, wherein the intensity distribution has an elliptical shape, and wherein the wiring part is disposed along a long axis direction of the elliptical shape.

4. The optical module according to claim 1, wherein a center of the light reception surface of the at least one light-receiving element is disposed so as to be deviated to a first direction perpendicular to an optical axis of the lens, and wherein the wiring part is disposed at a position along a second direction opposite to the first direction.

5. The optical module according to claim 4, wherein the at least one light-receiving element comprises a back-illuminated light-receiving element.

6. The optical module according to claim 1, wherein the at least one light-receiving element is disposed so as to incline a normal direction of the light reception surface with respect to an optical axis of the lens, and wherein the wiring part is disposed at a position along a direction of the inclination.

7. The optical module according to claim 6, wherein the at least one light-receiving element comprises one of a back-illuminated light-receiving element and a front-illuminated light-receiving element.

8. The optical module according to claim 1, further comprising: a plurality of band-pass filters aligned in line, through which the optical signal from the optical fiber enters; and a total reflection mirror which reflects the optical signal reflected on surfaces of the plurality of band-pass filters and which is disposed in opposite to the plurality of band-pass filters;

wherein the at least one light-receiving element comprises a plurality of the light-receiving elements aligned in a predetermined interval, and wherein the condenser lens condenses each of the optical signals exited from the plurality of band-pass filters onto each of the light reception surfaces of the plurality of the light-receiving elements.

9. The optical module according to claim 1, wherein the mesa part further includes a reflection layer between the light absorption semiconductor layer and the first semiconductor layer, wherein the electrode part has a ring shape, and wherein the optical signal from the optical fiber enters via the lens to the mesa part and is absorbed in the light absorption semiconductor layer, and thereafter, at least apart of the optical signal is further reflected in the reflection layer.

10. An optical module, comprising:

a light-receiving element configured to convert an incident optical signal to an electric signal, the light-receiving element including:

a mesa part configured to laminate at least a first semiconductor layer, a light absorption semiconductor layer that absorbs an optical signal entering from a light reception surface to convert the optical signal to an electric signal, and a second semiconductor layer;

an electrode part formed on a top of the mesa part; and a wiring part formed by elongating from a part of an outer periphery of the electrode part toward an outside of the mesa part so as to cover a part of side faces of the mesa part; and a lens for condensing an optical signal from an optical fiber onto the light reception surface of the light-receiving element, wherein a center axis of the light reception surface of the light-receiving element is disposed so as to be deviated to a first direction perpendicular to an optical axis of the lens, and wherein the wiring part is disposed at a position along a second direction opposite to the first direction.

11. The optical module according to claim 10, wherein the light-receiving element comprises a back-illuminated light-receiving element.

* * * * *